United States Patent [19]
Inoue et al.

[11] Patent Number: 5,406,211
[45] Date of Patent: Apr. 11, 1995

[54] JIGS FOR BURN-IN TEST

[75] Inventors: Kazuo Inoue, Tokorozawa; Hisasi Oguro, Atsugi, both of Japan

[73] Assignee: Japan Synthetic Rubber Co., Ltd., Tokyo, Japan

[21] Appl. No.: 143,059

[22] Filed: Oct. 29, 1993

[30] Foreign Application Priority Data

Oct. 30, 1992 [JP] Japan ................... 4-293280

[51] Int. Cl.$^6$ .............................................. G01R 1/04
[52] U.S. Cl. ..................................................... 324/758
[58] Field of Search ................ 324/758, 158 F–158 R; 439/86, 33, 482, 66

[56] References Cited

U.S. PATENT DOCUMENTS

| | | | |
|---|---|---|---|
| 4,975,079 | 12/1990 | Beaman et al. | 324/158 P |
| 5,046,953 | 9/1991 | Shreeve et al. | 439/68 |
| 5,172,050 | 12/1992 | Swapp | 324/158 P |

*Primary Examiner*—Kenneth A. Wieder
*Assistant Examiner*—Barry C. Bowser
*Attorney, Agent, or Firm*—Oblon, Spivak, McClelland, Maier, & Neustadt

[57] ABSTRACT

In accordance with the present invention, there are provided connection assemblies for burn-in test, wherein the test is carried out by electrically connecting inner terminals of a wiring pattern formed on a base substrate and terminals of a device to be tested to each other. These assemblies are equipped with a contact substrate having points of contact on both the top and bottom surface thereof and force the inner terminals and the terminals to connect electrically through the points of contact, a positioning plate for carrying out positioning of the contact substrate relative to the base substrate and have a positioning hole for locating the device, and a pressure mechanism for pressing the device toward the contact substrate. By use of the assemblies illustrated above, burn-in testing on LSI having a narrow pitch and multiple terminals may be carried out, the assemblies are available at low prime cost with high efficiency and, because of good exchangeability, it is possible to cope with damage to the contact substrate or changes in the types of articles of manufacture to be tested.

5 Claims, 5 Drawing Sheets

JIGS FOR BURN-IN TEST

FIELD OF THE INVENTION

This invention relates to jigs for a burn-in test which are used for the burn-in test on, for example, LSI including surface mount devices, such as QFP, SOP, LCC and the like, and TCP and the like.

BACKGROUND OF THE INVENTION

The burn-in test referred to above is a test which is carried out with the view of performing an accelerated extraction of a potential defective condition such as poor recovery properties or short lifetime dwelt in a device to be tested such as LSI or the like actually driven at elevated temperatures, and this test is usually applied to every LSI.

In carrying out this burn-in test, it is necessary to supply an electric source and signal to each terminal of the device, and at the same time, also necessary to withdraw the signal given by the device as tested through each terminal of said device, and there is used a jig for a burn-in test in order to meet the immediate necessities mentioned above.

As the jigs for use in the burn-in test of this sort, there have heretofore been known those as shown in FIGS. 10 and 11.

That is, the above-mentioned figures are to show a jig for burn-in test which is used in carrying out the burn-in test on a device 1 to be tested, such as LSI, for example, QFP or the like. This jig is composed of a base substrate 2 in the form of a rectangular flat plate and a plurality of sockets 3 arranged on the base substrate 2, said base substrate 2 being reinforced mechanically by means of a reinforcing frame 4 arranged on the periphery of the underside thereof.

When the burn-in test is carried out on the device 1 such as LSI or the like, the aforesaid sockets 3 are each designed to fixidly receive said device 1 therein, while positioning said device 1 in each socket 3. On that account, each socket 3 is provided with a receiving compartment equipped with a cover 6 for putting the device 1 in and removing it, said cover 6 opens and closes freely by means of a hinge 5, and a hook 7 which closes said cover 6 while pressing it downward.

Then in the position corresponding to each terminal (outer lead) 1a of the aforesaid device 1, there are arranged metallic springs 8, the top portion of which has been bent in a circular arc form so as to impart spring properties thereto, said metallic springs 8 being fixed by soldering to the base substrate 2 in such a state where the leg portion of each metallic spring 8 penetrates through the interior of said base substrate 2, and a circuit pattern (not shown) connected electrically to each metallic spring 8 extends, passing through said base substrate 2, to an outer terminal 2a provided on the side end of said substrate 2.

Thus, it is designed such that when the device 1 is received in the socket 3 and the cover 6 is closed by means of the hook 7, each terminal 1a of the device 1 is individually connected electrically to each metallic spring 8, and an electric source or signal is supplied to each terminal 1a of the device 1 through each outer terminal 2a extending from each metallic spring 8 and, at the same time, the signals may be taken out individually through each external terminal 2a from said device 1.

Recently, with increasing demand for LSI of high function and high capacity, the terminals of LSI are also highly tensioned and increased in number, for example, QFP having a terminal pitch of 0.3 mm or less and the number of terminals exceeding 200 has now come to be put to practical use.

In the prior example as mentioned above, however, when metallic springs are arranged in the interior of the socket so as to correspond to the narrow-pitched multiple terminals of LSI, it becomes considerably difficult to carry out this processing and, even if metallic springs could be arranged corresponding to said narrow-pitched multiple terminal of LSI, a mold for forming the socket becomes precise and intricate in its structure, thereby increasing the price of the socket and imposing a heavy burden on the testing cost. Moreover, because the surface area of the base substrate to be occupied by the sockets becomes considerably broadened, the number of the sockets that can be loaded on a piece of the base substrate is limited. Thus the prior art example mentioned above involved such a problem that no efficient burn-in test can be performed.

OBJECT OF THE INVENTION

The present invention has been made in view of such circumstances as mentioned above, and an object of the invention is to provide a jig for use in the burn-in test, said jig being so designed that it is capable of corresponding to LSI having a narrow pitch and multiple terminals to be tested in said jig and, moreover, that by omitting the use of sockets, the jig is reduced in cost and comes to have a high areal efficiency and, furthermore, because of good interchangeability it is readily capable of replenishment of damaged parts of the jig or alteration of the kind of the device to be tested.

SUMMARY OF THE INVENTION

The present invention provides a jig for burn-in test comprising:
  a base substrate having a wiring pattern formed thereon and inner terminals of the wiring pattern on the inside surface,
  a contact substrate having points of contact on both the top and bottom surface thereof, which is placed on the inside surface of the base substrate and, through said top and bottom points of contact, electrically connect each of said inner terminals of the base substrate with each of terminals of a device to be tested,
  a positioning plate for positioning said contact substrate relative to said base substrate, which has a positioning hole for holding the device therein to position said device relative to said contact substrate, and
  a pressuring mechanism for pressing said device toward said contact substrate to keep each of the terminals of the device electrically connected with each of the inner terminals of the base substrate.

In the jig of the present invention as illustrated above, both upper and lower points of contact of the aforesaid contact substrate may be formed from a pressurized conductive rubber connected electrically to the wiring pattern formed on said contact substrate.

Further it is also possible to form the aforesaid points of contact by projecting said points downward from the underside of said contact substrate and, at the same time, arrange respectively on the underside of said contact substrate a lower buffer having a thickness equal to the height of said lower point of contact and an upper buffer in the position above said lower point of contact formed on the top of said contact substrate, or apply a wiring pattern onto the surface of the U-shaped cuff formed by bending the end portions of said contact substrate, thereby forming both upper and lower points of contact at the end portions of said wiring pattern.

Furthermore, the pressurized conductive rubber may be embedded in the interior of the contact substrate so as to expose parts of said rubber to the upper and lower sides of said contact substrate, respectively, thereby forming the aforesaid points of contact at the top and underside of the thus exposed pressurized conductive rubber, respectively.

According to the jig of the present invention having a structure as illustrated above, the desired burn-in test may be performed by arranging the contact substrate in position through the positioning plate on the base substrate, throwing the device to be tested in the positioning hole of said positioning plate, and pressing down said device by means of a pressuring mechanism, thereby connecting electrically each terminal of said device and each inner terminal of said base substrate to each other.

Accordingly, the present invention makes it possible to perform the burn-in test on even 1SI of narrow pitch and of multiple terminals by connecting electrically and securely these terminals (outer leads) to inner terminals of the base substrate. In addition thereto, the invention has such effect that because of avoiding the use of the sockets, the use of molds having intricate structures becomes unnecessary and the prime cost can be curtailed, the areal efficiency is increased by reducing the area to be occupied by the sockets, and because of exchangeability of the contact substrate, it becomes possible to cope with break down of the contact substrate or alteration of the kind of the device to be tested.

Various other objects, features and attendant advantages of the present invention will be more fully appreciated as the same becomes better understood from the following detailed description when considered in connection with the accompanying drawings in which like reference characters designate like or corresponding parts throughout the several views and wherein:

DESCRIPTION OF THE PREFERRED EMBODIMENTS

Figure 1:
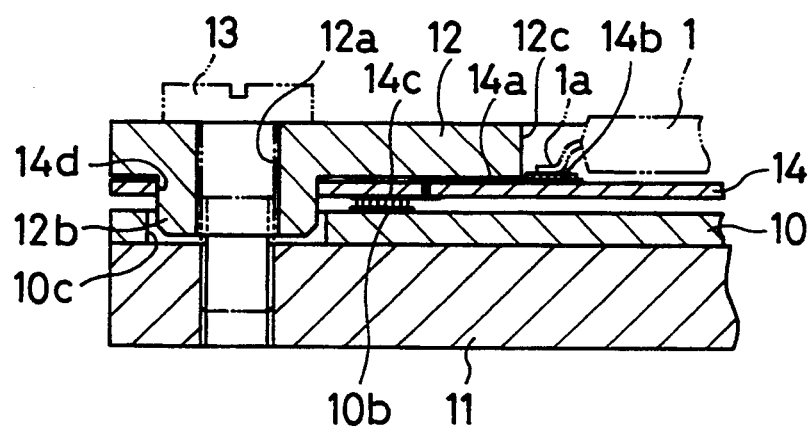
FIG. 1 is a cross-sectional view of a principal part (an enlarged cross-sectional view taken along line A—A in FIG. 2) showing the first embodiment of the present invention.
Figure 2:
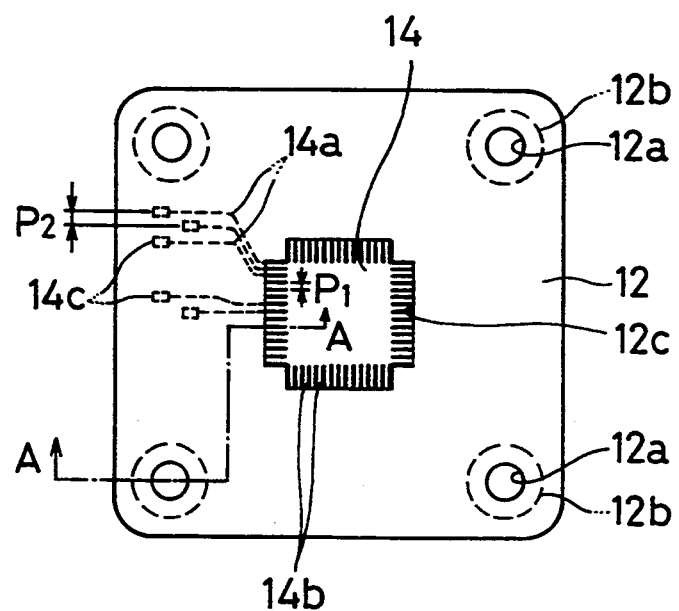
FIG. 2 is similarly a plate view showing a contact substrate being placed upon a positioning plate.

The embodiments of the present invention are illustrated below with reference to the accompanying drawings.

FIGS. 1–4 are intended to show the first embodiment of the invention, wherein a reference number 10 indicates a base substrate in the form of a rectangular-flat plate. This base substrate 10 is to supply an electric source or signal to a device 1 to be tested such as LSI or the like through each terminal (outer lead) 1a and also to take out a signal from the device 1, and circuit patterns therefor (not shown) are formed on the surface and back of said base substrate 10. At the end of each circuit pattern outer terminals 10a as the input and output terminals for the outside are provided at both the surface and back of the base substrate 10, and inner terminals 10b as the input and output terminals for the device 1 are provided on the surface side of the base substrate 10.

This base substrate 10 is composed from heat resistant substrate materials such as, for example, BT plate, polyimide substrate, FR-5 and is reinforced with such a reinforcing plate 11 as made of aluminum or PPS disposed on the underside thereof.

Figure 3:
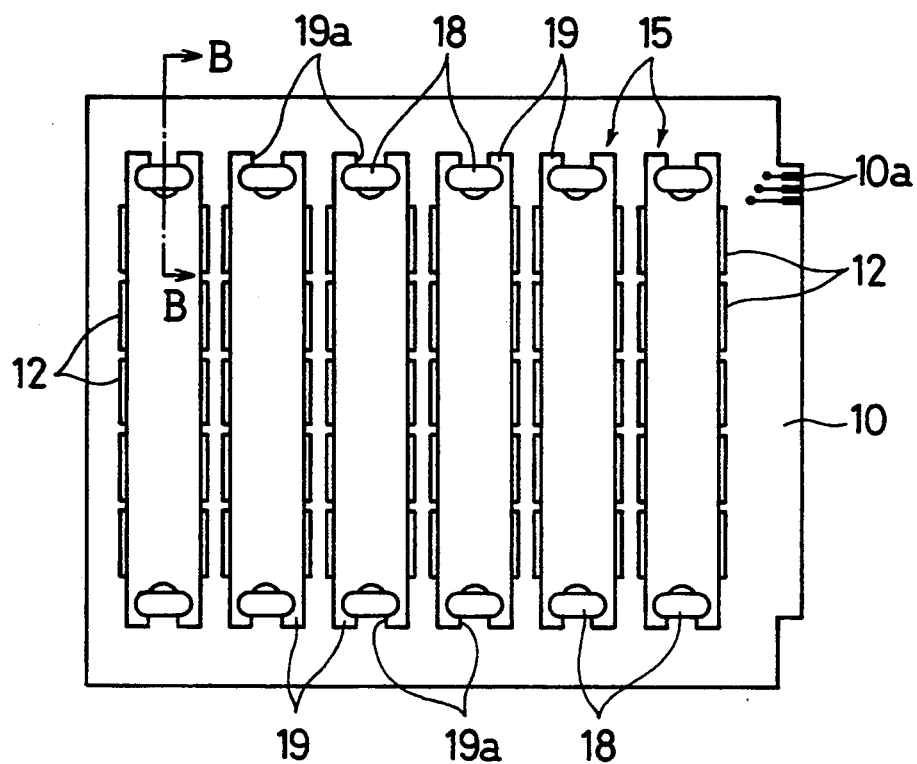
FIG. 3 is similarly shown a plane view.

On the top surface of the base substrate 10 as shown in FIG. 3, the positioning plates 12 totaling to 30 pieces lined up in six rows of five plates are individually fixed to the base substrate 10 by means of bolts 13 screwed into a reinforcing plate 11 through bolt holes 12a as shown in FIG. 1, and a contact substrate 14 is interposed between the positioning plate 12 and the base substrate 10.

This contact substrate 14 is intended to individually contact electrically each inner terminal 10b of the base substrate 10 and each terminal 1a of the device 1 to each other through said contact substrate 14, and the contact substrate 14 is composed, for example, of heat resistant PWB or heat resistant FPC, and both upper and lower surfaces of the contact substrate 14 are equipped with upper points of contact 14b and lower points of contact 14c respectively, connected to each end of a wiring pattern 14a penetrated through the interior of said contact substrate 14.

That is, it is so designed that the burn-in test is carried out by bringing each inner terminal 10b of the base substrate 10 into contact with each lower point of contact 14c of the contact substrate 14, and bringing each terminal 1a of the device 1 into contact with each upper point of contact 14b of the contact substrate 14, thereby connecting electrically each inner terminal 10b of the base substrate 10 and each terminal 1a of the device 1 to each other.

In that case, in view of vital importance of performing positioning of the contact substrate 14 relative to the base substrate 10, and of the device 1 relative to the contact substrate 14, the positioning plate 12 is provided so as to perform the positioning of the contact substrate 14 relative to the base substrate 10 and the positioning of the device 1 relative to the contact substrate 14.

That is, positioning bosses 12b are provided at the four corners of the reverse side of the positioning plate 12, and fixing holes 14d are provided at the four corners of the contact substrate 14 corresponding to said positioning bosses 12b and penetration holes 10c are provided at the positions corresponding to the positioning bosses 12b of the positioning plate 12 as assembled to the base substrate 10. Further, in the case of the surface mount device, for example, QFP or SOP, in the interior of the positioning plate 12, there is provided a positioning hole 12c worked up on the basis of the pattern agreed with the shape of the device 1 so that said device 1 is positioned at the side end of the lead.

By virtue of the structure of the jig of the invention illustrated above as the first embodiment, it is designed that the positioning of the contact substrate 14 to the base substrate 10 is performed by introducing the positioning boss 12b of the positioning plate 12 being inserted into the interior of the fixing hole 14d of the contact substrate 14 into a penetration hole 10c of the base substrate 10, and fixing the positioning boss 12b to the base substrate 10 by means of a bolt 13, that is, each lower point of contact 14c of the contact substrate 14 and each inner terminal 10b of the base substrate 10 are brought into contact with each other. In addition it is designed that the positioning of the device 1 to the contact substrate 14 is performed by putting the device 1 into the positioning hole 12c of the positioning plate 12, that is, each upper point of contact 14b of the contact substrate 14 and each terminal 1a of the device 1 are brought into contact with each other.

The positioning plate 12 is a molded product of such heat resistant plastics, for example, as PPS, LPC, etc., or a workpiece prepared from the same material as PWB, and it is desirable to use the positioning plate having the same thermal coefficient of expansion in the plane direction as that of the contact substrate 14.

The positioning of the device 1 to the contact substrate 14 is performed at the side end of the terminal 1a.

The upper point of contact 14b and lower point of contact 14c of the contact substrate 14 are composed of a pressurized conductive rubber. The points of contact 14b and 14c made of the pressurized conductive rubber may be formed, for example, by forming an opening by means of a resist, and embedding the pressurized conductive rubber in the opening, followed by removing the resist therefrom or by printing.

The pressurized conductive rubber used herein is a sheet-like electrically conductive composite material consisting of silicone rubber and metallic powders incorporated into said silicone rubber, and is so designed that the metallic powders come into contact with one another so as to have electrical conductivity when said composite material is pressed. By the use of this pressurized conductive rubber in the points of contact 14b and 14c, it is possible to prevent poor contact among the each inner terminal 10b of the base substrate 10, each lower and upper point of contact 14b, 14c of the contact substrate 14 and each terminal 1a of the device 1 because they will be brought into surface contact with one another, and it is also possible to prevent each terminal 1a of the device 1 from marring.

As the pressurized conductive rubber of the invention as aforesaid, it is possible to use an anisotropic pressurized conductive rubber having conductivity in the direction of thickness but having no conductivity in the planer direction, and in this case, it is possible to form the aforesaid upper point of contact 14b and lower point of contact 14c by means of a continued sheet of the anisotropic pressurized conductive rubber.

The anisotropic pressurized conductive rubber as aforesaid is of two types, one of which is a dispersion type wherein conductive passes formed perpendicularly to the sheet surface are distributed on the sheet surface on an average, and the other is a maldistribution type wherein a conductive part in which the conductive passes are assembled is separated from an insulating part consisting of rubber only, and the conductive part is formed in agreement with the pattern of the inspection electrodes.

It is necessary herein to correspond the upper points of contact 14b to the terminals 1a of the device 1 and also to make pitches P1 of said upper points of contact 14b equal in pitch to the pitches of the device 1, and hence the contact substrate 14 is provided with a wiring pattern 14a and the lower points of contact 14c are arranged alternately over two rows, thereby sufficiently broadening the pitches P2 of the lower points of contact 14c.

By practicing the transformation of pitch by means of the contact substrate 14 in the manner as mentioned above, the contact substrate 14 can corresponded to a narrow-pitched device 1.

Figure 4:
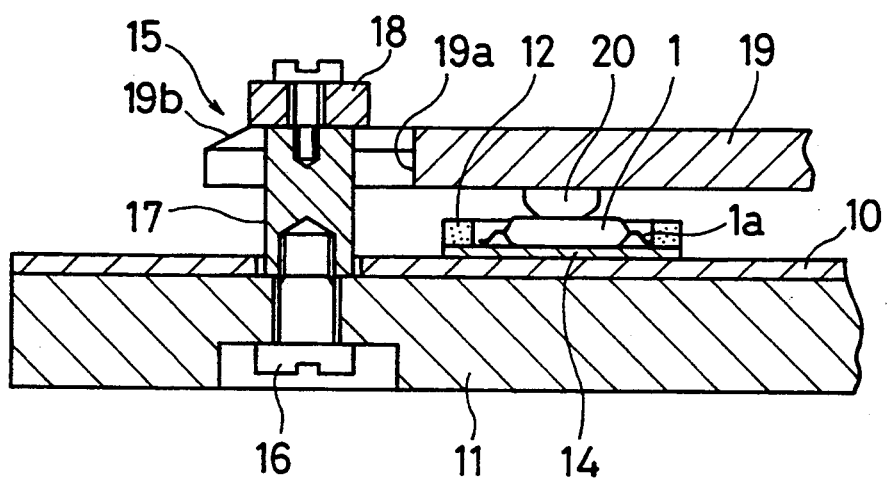
FIG. 4 is an enlarged cross-sectional view taken along line B—B in FIG. 3.

Then, the pressure mechanisms 15 are each provided on every one row so that each device 1 is pressed downward to bring each terminal 1a of said device 1, each upper point of contact 14b and lower point of contact 14c of the contact substrate 14, and each inner terminal 10b of the base substrate 10 are brought into contact with one another. As shown in FIG. 4, this pressure mechanism 15 is composed essentially of a support 17 provided in the vertical direction on the surface of the base substrate 10 through a bolt 16, rotary nail 18 supported rotatably on the top of said support 17, a pressure stay 19 having at both ends thereof U-shaped cutouts 19a through which the rotary nail 18 is passed, and a pressure stay 20 consisting of an elastic body or the like and formed on the under surface of the pressure stay 19 so as to press down the top surface of each device 1.

The above-mentioned pressure stay 19 consisting of such heat resistant plastics, for example, as PPS, LCP or the like, or such material as aluminum or the like is designed that this pressure stay 19 is provided with a tapered part 19b gradually increasing in section thickness from the inside face to the end of the cutouts 19a of both ends of the pressure stay 19, the rotary nail 18 is allowed to pass through the cutouts 19a in agreement with the shape thereof, and the rotary nail 18 is then rotated to run onto the pressure stay 19 along the taper part 19b, thereby obtaining a pressure loading.

In carrying out the burn-in test on the device 1 using the above-mentioned jig of the invention, the contact substrate 14 is fitted first in place in the base substrate 10 through the positioning plate 12, and said device 1 is thrown into the positioning hole 12c of said positioning plate 12. Subsequently, the pressure stay 19 of the pressuring mechanism 15 is fitted in position so as to hold said device 1 inescapably and also press down said device 1. Thereupon, each inner terminal 10b of the base substrate 10 and each terminal 1a of the device 1 are electrically connected to each other through the contact substrate 14.

In this state of the jig as mentioned above, the burn-in test is carried out at high temperatures by supplying an electric source or signals to each terminal 1a of the device 1 from the outer terminal 10a of the base substrate 10 and, at the same time, by receiving the signal from each terminal 1a of said device 1.

In the embodiment of the invention as illustrated above, it is intended to press the top of the device 1 by pressure stay 20, however, it is also possible to press the terminal (outer lead) 1a of the device 1 by means of a pressurizing part formed from a non-conductive rigid body.

Though this embodiment shows an instance of using the contact substrate having about the same shape as that of the positioning plate, it is also possible to use a contact substrate so prepared as to spread over two or three positioning plates.

Figure 5:
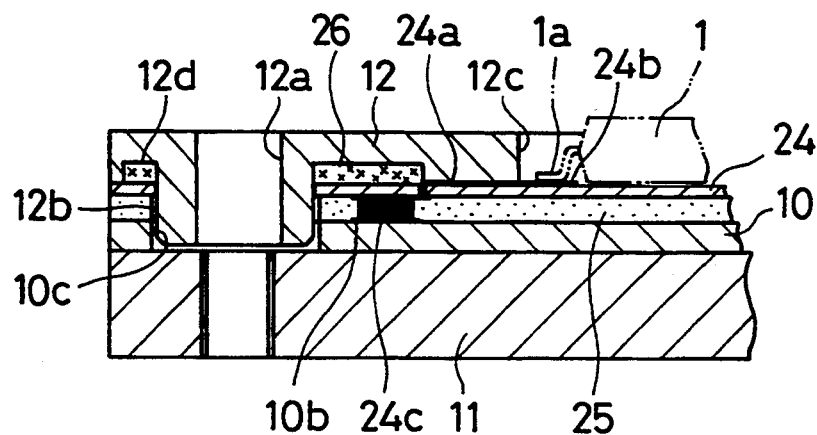
FIG. 5 is a view corresponding to FIG. 1 showing the second embodiment of the invention.

FIG. 5 is intended to show the second embodiment of the invention, wherein the contact between metals, instead of the aforesaid pressurized conductive rubber, is allowed to perform the intended electrical connection between them, and this embodiment differs from the above-mentioned first embodiment of the invention in the following points.

That is, in this second embodiment of the invention, an upper point of contact 24b connected to a wiring pattern 24a of a contact substrate 24 is formed from a metallic plate, and similarly a lower point of contact 24c is formed, for example, from a projection prepared by gilding the bottom face of a copper deposit. Then, a lower buffer 25, for example, made of silicone and having almost the same thickness as the height of the lower point of contact (projection) 24c is arranged on the lower surface of the contact substrate 24 to cover almost all the area, and similarly an upper buffer 26, for example, made of silicone is arranged on the top surface of contact substrate 24 extending toward the external side of the top surface of the lower point of contact 24 and, in addition, a concavity 12d is formed on the under surface of the positioning plate 12 corresponding to the upper buffer 26.

In this second embodiment of the invention, the scattering in contact between each terminal 1a of the device 1 and each upper point of contact 24b of the contact substrate 24 is absorbed mainly by the lower buffer 25, and the scattering in contact between each inner terminal 10b of the base substrate 10 and the lower point of contact 24c of the contact substrate 24 is absorbed mainly by the upper buffer 26, thereby realizing the contact of the metals between them.

Figure 6:
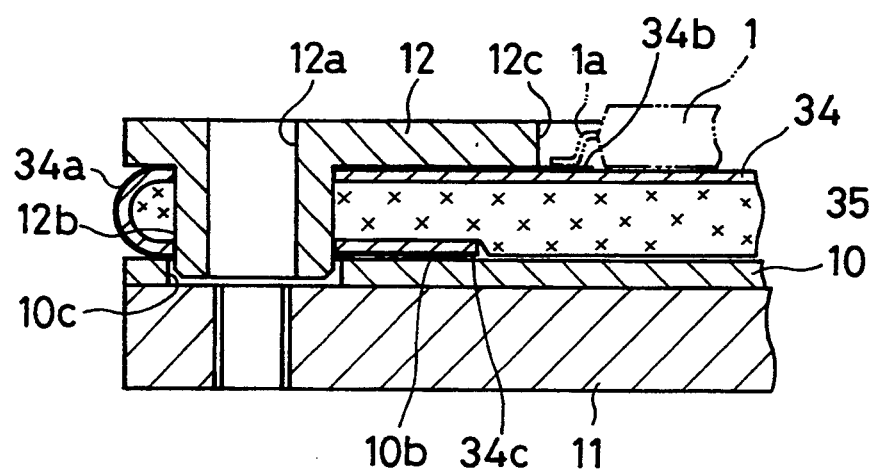
FIG. 6 is a view corresponding to FIG. 1 showing the third embodiment of the invention.

FIG. 6 is intended to show the third embodiment of the invention, wherein the contact of metals between them is realized in the same manner as in the second embodiment mentioned above. In this embodiment, a U-shaped edge extending inwardly is formed at the ends of a contact substrate 34. A wiring pattern 34a is provided along the surface of the turned edge, a metallic upper point of contact 34b and a metallic lower point of contact 34c are formed respectively at the ends of the wiring pattern 34a and, in addition, an intermediate buffer 35 is inserted into the U-shaped turned edge so as to spread over almost all the area under the contact substrate 34.

In this third embodiment of the invention, it is sufficient to use only one sheet of buffer because the intermediate buffer 35 is situated on the extension of line between the contact portion of each terminal 1a of the device 1 and each upper point of contact 34b of the contact substrate 34 and the contact portion of each inner terminal 10b of the base substrate 10 and each lower point of contact 34c of the contact substrate 34.

Figure 7:
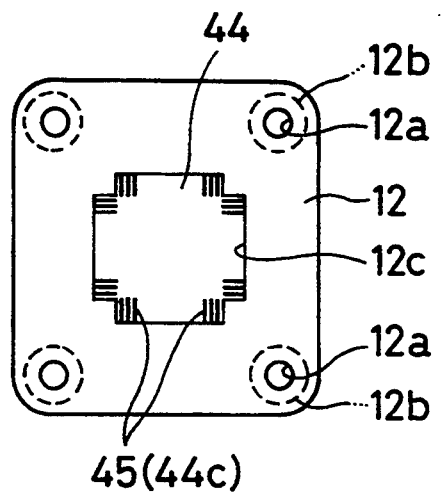
FIG. 7 is a view corresponding to FIG. 2 showing the fourth embodiment of the invention.
Figure 8:
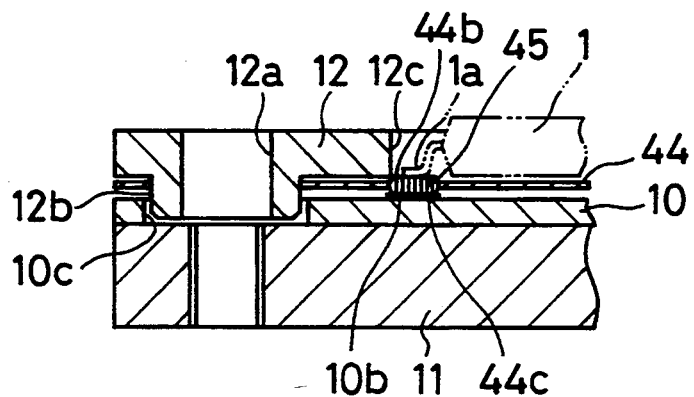
FIG. 8 is similarly a view corresponding to FIG. 1.

FIGS. 7 and 8 are intended to show the fourth embodiment of the invention. In this embodiment of the invention, instead of performing the transformation of pitch by means of a contact substrate 44, an opening is provided at the position of the contact substrate 44 corresponding to each terminal 1a of the device 1, and a pressurized conductive rubber 45 is embedded in this opening, whereby the top surface and under surface of the pressurized conductive rubber 45 are used as an upper point of contact 44b and an lower point of contact 44c, respectively.

In this manner, by forming the points of contact 44b and 44c from the pressurized conductive rubber 45 used as the material therefor, the contact between each inner terminal 10b of the base substrate 10 and each terminal 1a of the device 1 has an increased contact surface area and, moreover, the accuracy of the positioning is improved by performing the positioning of both the contact substrate 44 and the device 1 simultaneously, and thus the structure of this kind may be realized.

In this connection, it is needless to say that the aforementioned anisotropic pressurized conductive rubber may be used as the pressurized conductive rubber used in the embodiment mentioned above.

Figure 9:
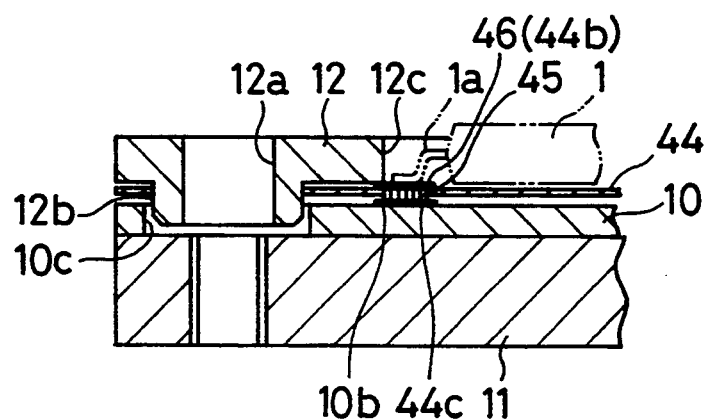
FIG. 9 is a view corresponding to FIG. 1 showing the fourth embodiment of the invention as modified.
Figure 10:
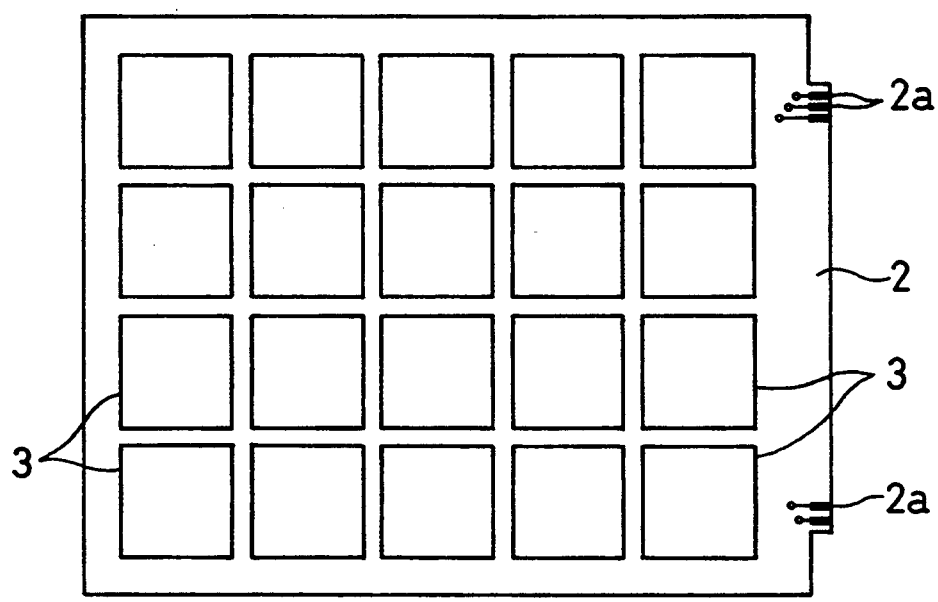
FIG. 10 is a whole plane view showing an example of prior art.
Figure 11:
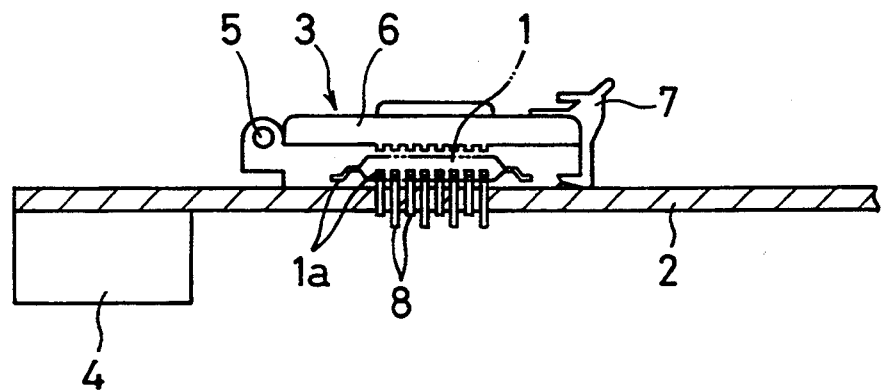
FIG. 11 is similarly is an enlarged cross-sectional view of a principal part of the prior art example.

In this embodiment, as shown in FIG. 9, it is possible to laminate a metal sheet 46 on the top surface of the pressurized conductive rubber 45, whereby the metal sheet 46 is used as the upper point of contact 44b.

What is claimed is:

1. A connector assembly for burn-in test comprising:
    a base substrate having a wiring pattern formed thereon and inner terminals of the wiring pattern on the inside surface,
    a contact substrate having points of contact on both the top and bottom surface thereof, which is placed on the inside surface of the base substrate and, through said top and bottom points of contact, electrically connect each of said inner terminals of the base substrate with each of terminals of a device to be tested,
    a positioning plate for positioning said contact substrate relative to said base substrate, which has a positioning hole for holding the device therein to position said device relative to said contact substrate, and
    a pressure mechanism for pressing said device toward said contact substrate to keep each of the terminals of the device electrically connected with each of the inner terminals of the base substrate.

2. The assembly for burn-in test as claimed in claim 1 wherein both the upper and lower points of contacts of the contact substrate comprise pressurized conductive rubber which are electrically connected to each other through the wiring pattern formed on the contacting substrate.

3. The assembly for burn-in test as claimed in claim 1 wherein the lower point of contact is formed so as to protrude from the bottom side of the contact substrate, a lower buffer having a thickness corresponding to the height of the lower point of contact is arranged on the bottom side of said contact substrate, and an upper buffer is arranged on the upper side of said contact plate in a position above said lower point of contact.

4. The assembly for burn-in test as claimed in claim 1 wherein the end portion of the contact substrate is turned up so as to form a cuff, the wiring pattern is formed on the surface of the cuff, and both the upper and lower points of contact are formed on the end portion of said wiring pattern.

5. The assembly for burn-in test as claimed in claim 1 wherein pressurized conductive rubber is embedded in the interior of the contact substrate so as to protrude upwardly and downwardly from the top and under surface of the contact substrate, and the upper and lower points of contact are formed at the top and bottom surfaces of said protruded rubber, respectively.

* * * * *